United States Patent [19]

Mitchell

[11] Patent Number: 4,744,712
[45] Date of Patent: May 17, 1988

[54] APPARATUS AND METHOD FOR AN IMPROVED WAFER HANDLING SYSTEM FOR CANTILEVER TYPE DIFFUSION TUBES

[76] Inventor: Ron Mitchell, 3111 S. Park Dr., Tempe, Ariz. 85282

[21] Appl. No.: 860,331

[22] Filed: May 6, 1986

[51] Int. Cl.⁴ .................. B65G 53/00; F16M 13/00
[52] U.S. Cl. .................. 414/217; 108/145; 248/421
[58] Field of Search .......... 108/137, 143, 117, 116, 108/119; 248/421; 414/217

[56] References Cited

U.S. PATENT DOCUMENTS

| 399,220 | 3/1889 | Timroth | 108/145 X |
| 2,829,863 | 4/1958 | Gibson | 108/117 X |
| 3,917,211 | 11/1975 | Daunderer et al. | 248/421 |
| 4,116,548 | 9/1978 | Persson | 298/421 X |

FOREIGN PATENT DOCUMENTS 3104182 12/1981 Fed. Rep. of Germany ...... 108/117

*Primary Examiner*—James T. McCall
*Attorney, Agent, or Firm*—Harry M. Weiss & Associates

[57] ABSTRACT

The instant invention relates to a loading system for loading semiconductor wafers into a diffusion tube. The combination of a track and a loader trolley designed for the track is disclosed, along with mechanisms for coarse and fine adjustments of the height of the loader platform of the loader trolley. These adjustments can be made without any shims or spacers.

2 Claims, 4 Drawing Sheets

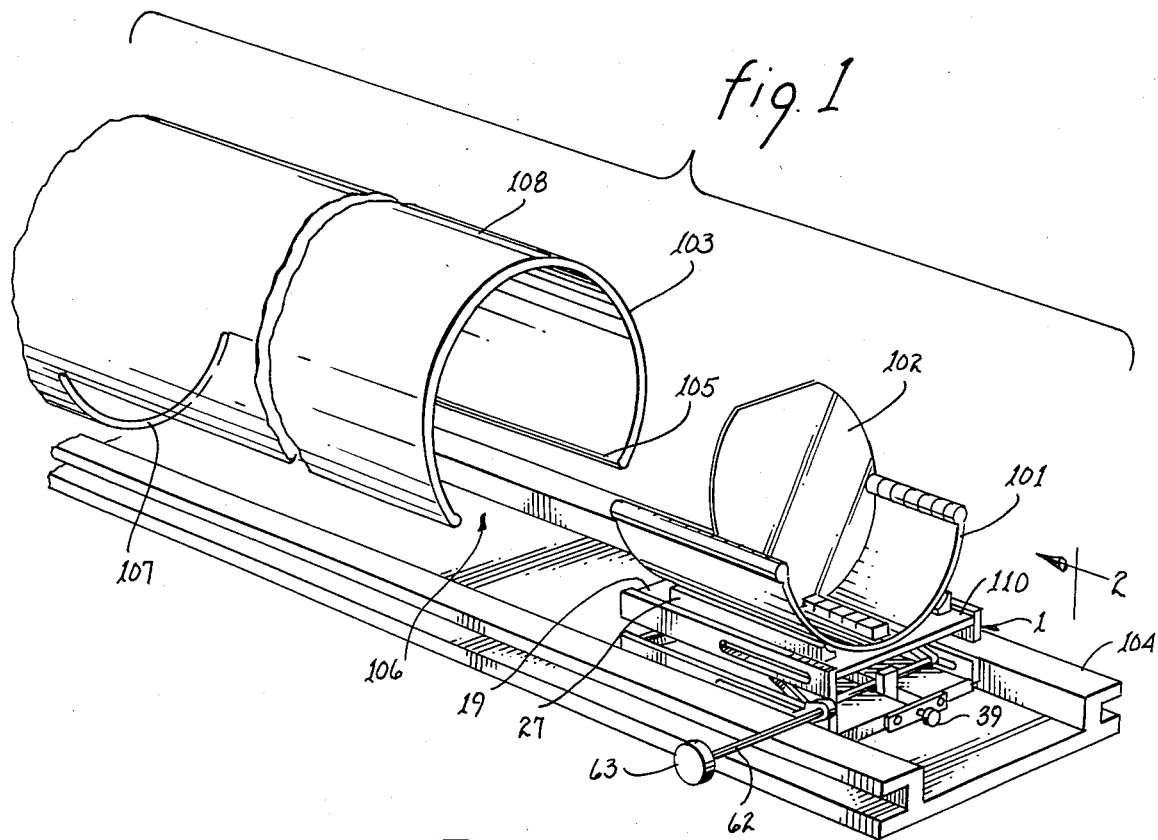
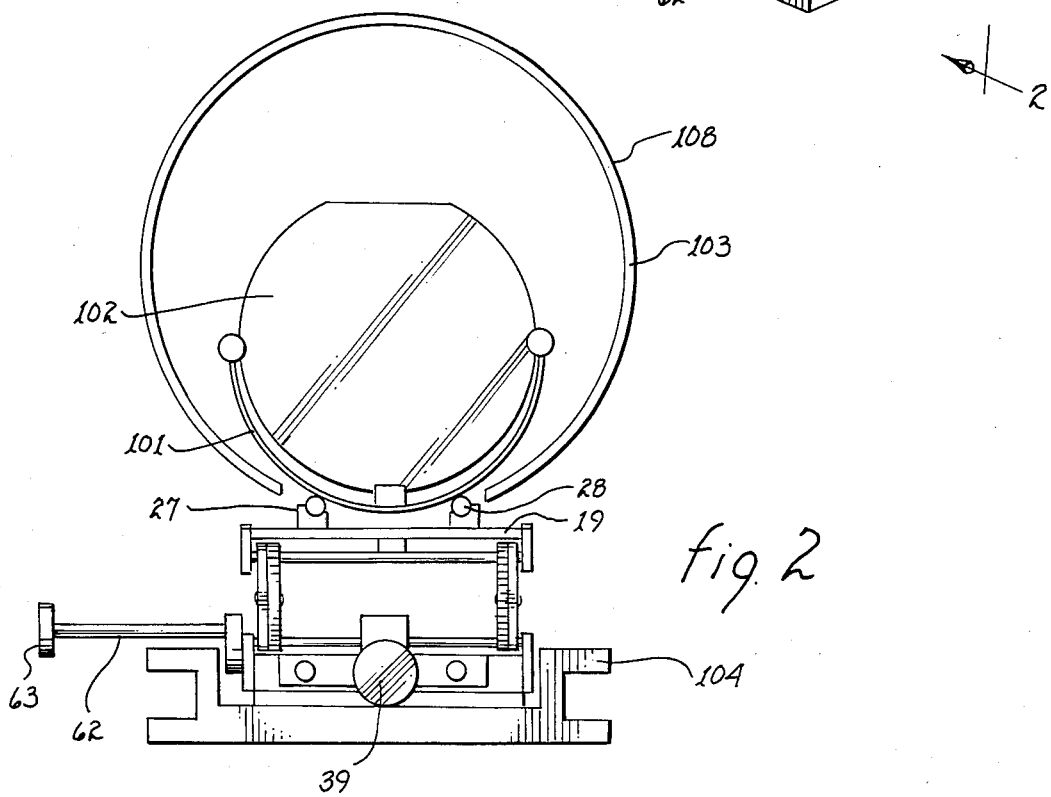

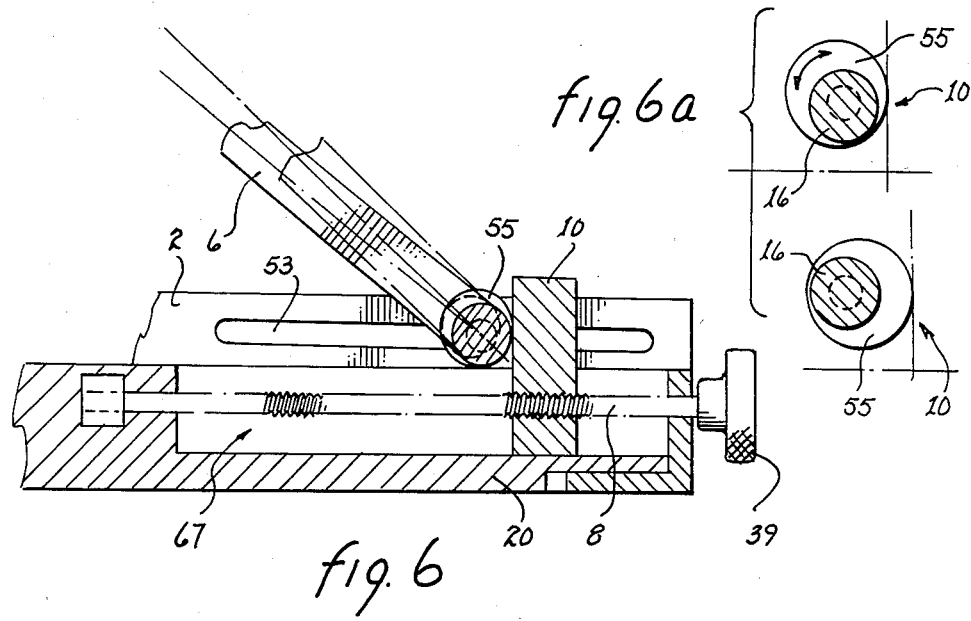
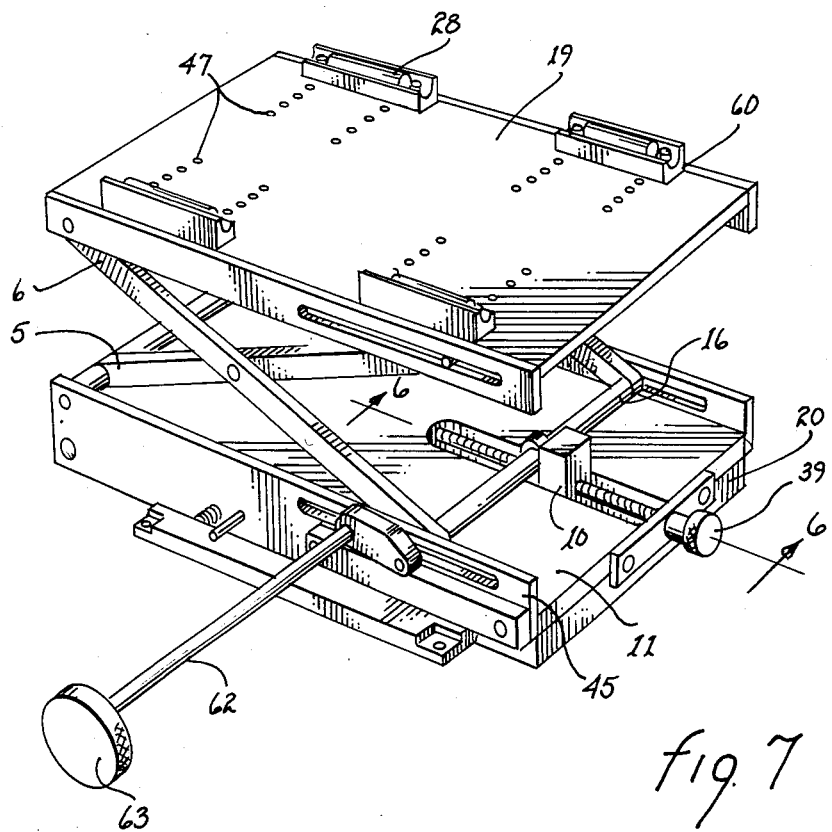

4,744,712

APPARATUS AND METHOD FOR AN IMPROVED WAFER HANDLING SYSTEM FOR CANTILEVER TYPE DIFFUSION TUBES

BACKGROUND OF THE INVENTION

1. Field of the Invention

The present invention relates to an improved way of depositing semiconductor wafers into a cantilever diffusion tube.

2. Description of the Prior Art

In the handling of semiconductor wafers, it was necessary to do numerous manual adjustments using shims and spacers in order to obtain proper height adjustment of a loader trolley. Even with proper height adjustment, alignment of the loader trolley longitudinal axis with the longitudinal axis of the diffusion tube would cause numerous problems.

SUMMARY OF THE INVENTION

It is an object of this invention to provide a simple and reliable method for adjusting the height of a loader trolley.

It is a further object of this invention to provide a simple and reliable method to obtain proper alignment of a quartz wafer boat with the longitudinal axis of a diffusion tube.

It is a still further object of this invention to eliminate the use of shims and spacers in the semiconductor wafer diffusion process.

The aforementioned and other objects are accomplished, according to the present invention by providing a loader trolley and track combination wherein said loader trolley has a coarse and fine adjustment for height of the loader plate which can be easily set without use of external spacers and shims.

The foregoing and other objects, features and advantages of this invention will be apparent from the following, more particular, description of the preferred embodiments of this invention, as illustrated in the accompanying drawings.

BRIEF DESCRIPTION OF THE DRAWINGS

FIG. 1 is an illustration of the cantilever loading trolley in a loading track with a wafer holder positioned on the cantilever loading trolley and the end of a cantilever diffusion tube.

FIG. 2 is an end view illlustration of the cantilever loading trolley in a loading track holding a wafer holder inside the cantilever diffusion tube.

FIG. 6 is a partial cross-sectional view taken along the line 6—6 of FIG. 7.

FIG. 6a is a dual cross-sectional view showing the fine adjustment cam in relationship to the bottom adjustment axle and the coarse adjustment following member.

FIG. 7 is perspective view of the invention in a vertical or expanded mode.

DESCRIPTION OF THE PREFERRED EMBODIMENT

Figure 3:
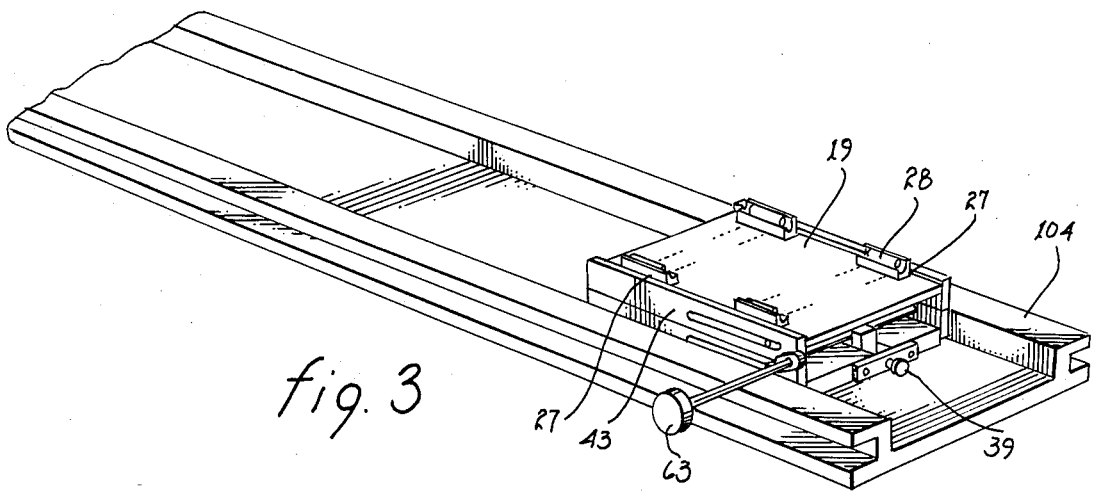
FIG. 3 is an illustration of the cantilever loading trolley in a loading track.
Figure 4:
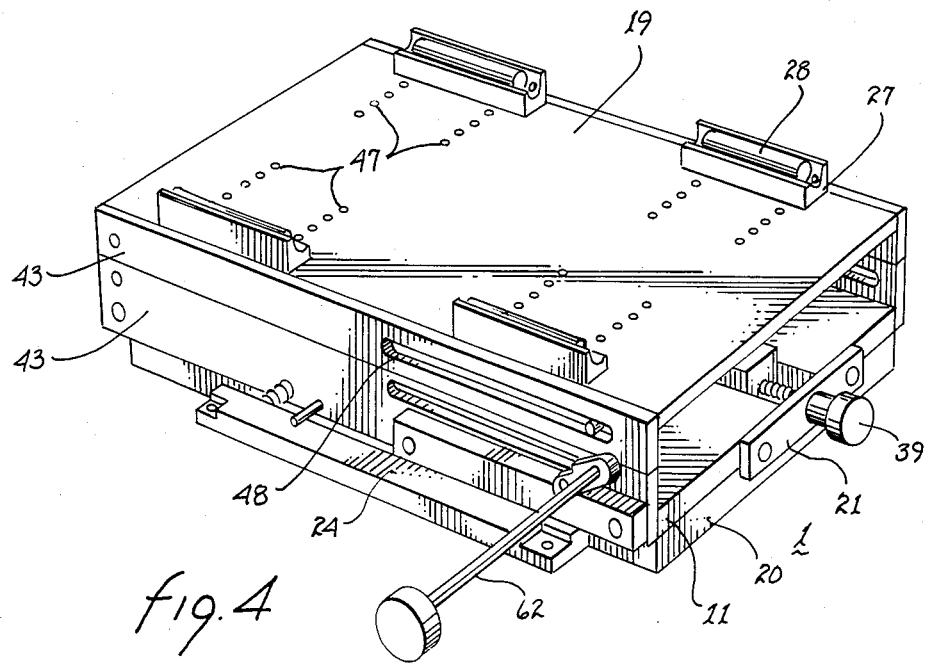
FIG. 4 is a perspective view of the cantilever loading trolley.

There is a need in the manufacturing process for semiconductors for a means of positioning semiconductor wafers into a chemical diffusion tube. It is critical in this portion of the manufacturing process that the environment be as contaminant free as possible. Because of this requirement, it is also critical that handling be held to a minimum.

Referring now to FIG. 1, a quartz wafer boat 101, holding a plurality of semiconductor wafers 102 (one shown), is resting on the cantilever loading trolley 1. In order to insert the quartz wafer boat 101 into the cantilever diffusion tube 108, the quartz wafer boat 101 is elevated slightly above the bottom lips 105 of the slot 106 cut in the bottom of the cantilever diffusion tube 108. The cantilever loading trolley 1 then moves the quartz wafer boat 101 into the cantilever diffusion tube 108 until it reaches the end of the slot 107. The carrier 110 on the cantilever loading trolley 1 then is lowered by the operator and is pulled back up the loading track 104. This leaves the quartz wafer boat 101 inside the cantilever diffusion tube 108 resting on the bottom lips of the slot 105. FIG. 2 illustrates the quartz wafer boat 101 resting on the carrier 110 slightly above the bottom lips of the slot 105.

As the quartz wafer boat 101 is deposited into the cantilever diffusion tube 108, the end of the cantilever diffusion tube, 103, will tend to deflect downward because of the weight of the quartz wafer boat 101. This requires that the cantilever loading trolley 1 be adjustable to compensate for this downward deflection. it is also a requirement that there be no lateral movement or rocking of the quartz wafer boat 101 while it is resting on the cantilever loading trolley 1.

Another quartz wafer boat 101 is placed on the cantilever loading trolley 1 and the process is repeated. However, the cantilever loading trolley 1 is moved into the cantilever diffusion tube 108 only up to the previously deposited quartz wafer boat 101. The process is then repeated until the cantilever diffusion tube 108 is filled to its capacity with a plurality of quartz wafer boats 101.

Figure 5:
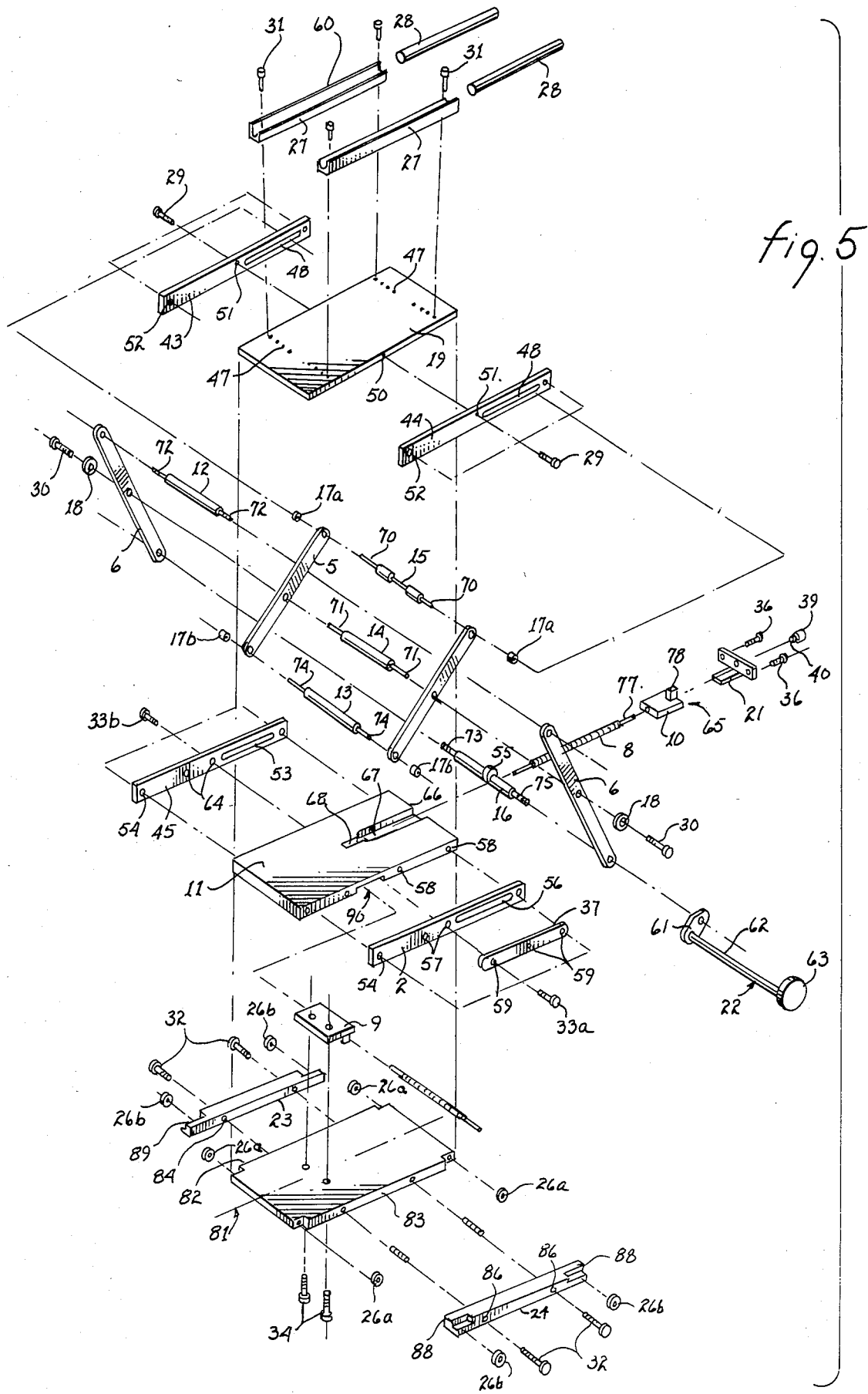
FIG. 5 is an exploded view of parts comprising the cantilever loading trolley.

Referring now to FIG. 5, the quartz wafer boat 101 rests on a plurality of quartz rods 28. Although only one long pair of quartz rods 28 is shown in the preferred embodiment, several shorter pairs can be used. Each quartz rod 28 is placed in a rod carrier 27. The shape of the slot 60 in the rod carrier 27 is such that the quartz rod 28 can only slide in either end of the rod carrier. The rods are held in place by attaching screws 31 at each end of the rod carrier 27. The plurality of rod carriers 27 are attached to a carrier top plate 19 using attachment screws 31. The carrier top plate 19 has a plurality of holes 47 drilled and tapped to allow the rod carriers 27 to be moved laterally and thus be able to accommodate quartz wafer boats of different radii. At each longitudinal side of the carrier top plate 19 is a top side rail 43 and 44. The top side rails 43 and 44 are attached to carrier top plate 19 using a plurality of screws 29. The screws 29 traverse the top side rails 43 and 44 through holes 51 and are attached to the carrier top plate 19 via tapped holes 50. Each of the top side rails 43 and 44 have a slot 48 cut into them to accommodate the movable portion of first height adjustment members 5. Each of the top side rails 43 and 44 also have a single hole 52 drilled into them to accommodate the fixed portion of second height adjustment members 6. First height adjustment member 5 are movably attached to top moveable axle 15. Each end 70 of top moveable axle 15 has mounted on it one of the first height adjustment members 5 and a spacer element 17a. Each end 70 of top moveable axle 15 is then inserted into one of the slots 48 of the top side rails 43 and 44. Second height adjustment members 6 are movably attached to top stationary axle 12. Each end 72 of top stationary axle 12 has mounted on it one of the second height adjustment members 6. Each end 72 of top stationary axle 12 is then inserted into one of the holes 52 of the top side rails 43 and 44.

The centers of first height adjustment members 5 and second height adjustment members 6 are joined together at the center with center height adjustment axle 14. Each end 71 of center height adjustment axle 14 is attached to one of the first height adjustment members 5, then one of the second height adjustment members 6. The height adjustment members 5 and 6 are held onto the center height adjustment axle 14 by means of washer 18 and screw 30 at each end 71 of the center height adjustment axle 14.

The bottoms of first height adjustment members 5 are attached to bottom stationary axle 13. The ends 74 of bottom stationary axle 13 are inserted into holes 54 of bottom side rails 2 and 45. Each end 74 of bottom stationary axle 13 has mounted on it one of the first height adjustment members 5 and a spacer element 17b. Bottom side rail 2 and 45 are attached along the longitudinal sides of center plate 11. Typically, top stationary axle 12 will be directly over bottom stationary axle 13 regardless of the height of the top plate 19 above the center plate 11.

The bottoms of second height adjustment members 6 are attached to bottom adjustment axle 16. The left end 73 and right end 75 of bottom adjustment axle 16 are inserted into left slot 53 and right slot 56 of left bottom side rail 2 and right bottom side rail 45 respectively. Bottom adjustment axle 16 also has a fine adjustment cam 55 positioned in the center of the axle. The right end 75 of bottom adjustment axle 16 protrudes beyond the right bottom side rail 2 and is immovably attached to fine adjustment knob 22. Fine adjustment knob 22 comprises an attaching member 61, an extension shaft 62 and a knob 63. As knob 63 is turned, bottom adjustment axle 16 is turned and the fine adjustment cam 55 is repositioned. There is a stop bar 37 attached to right bottom side rail 2. The purpose of the stop bar 37 is to limit the allowable range of motion of attaching member 61 of the fine adjustment knob 22. The stop bar 37 is attached to center plate 11 using a plurality of attaching screws 33a. Attaching screws 33a are inserted through holes 59 in stop bar 37 and through holes 57 in right bottom side rail 2 and attached to threaded holes 58 in center plate 11. The left bottom side rail 45 is attached to center plate 11 using a plurality of attaching screws 33b. Attaching screws 33b are inserted through holes 64 in left bottom side rail 45 and attached to threaded holes 58 in center plate 11.

A course adjustment mechanism 65 is attached to the rear 66 of center plate 11. The course adjustment mechanism 65 comprises a threaded coarse adjustment screw 8, a coarse adjustment following member 10, a coarse adjustment mechanism attaching means 21, and a coarse adjustment knob 39. The coarse adjustment mechanism 65 is held onto center plate 11 using two attaching screws 36. The coarse adjustment knob 39 is held onto a smooth end 77 of the threaded coarse adjustment screw 8 by means of screw 40. A fine adjustment block 78 is the top part of the coarse adjustment following member 10. The threaded coarse adjustment screw 8, along with the coarse adjustment following member 10 is mounted in a slot 67 in center plate 11. The other end of the threaded coarse adjustment screw 8 is held in place by hole 68 in center plate 11.

A key plate 9 is attached to bottom plate 20 with two attaching screws 34. Center plate 11 is lipped onto key plate 9 along key slot 90. Once right side rail 2 is attached to center plate 11, the key slot 90 is concealed from veiw.

Bottom plate 20 has at each corner a fixed wheel 26a oriented so that bottom plate 20 rolls along its longitudinal axis 81. Attached to the left side 82 of bottom plate 20 is a bottom left tracking rail 23. Bottom left tracking rail 23 is attached to the left side 82 of bottom plate 20 with screws 32. Screws 32 are inserted through holes 84 in bottom left tracking rail 23 and attached to threaded holes 87 in bottom plate 20. Corners 89 of bottom left tracking rail 23 are the upper corners furthermost away from side 82 of bottom plate 20. Attached to corners 89 of bottom left tracking rail 23 are fixed wheels 26b to allow bottom plate 20 to roll along the inside of loading track 104. Attached to the right side 83 of bottom plate 20 is a bottom right tracking rail 24. Screws 32 are inserted through holes 86 in bottom right tracking rail 24 and attached to threaded holes 85 in bottom plate 20. Springs 25 are inserted between side 83 and partly into holes 86. Corners 88 of bottom right tracking rail 24 are the upper corners furthermost away from right side 83 of bottom plate 20. Attached to corners 88 of bottom right tracking rail 24 are fixed wheels 26b to allow bottom plate 20 to roll along the inside of cantilever track 104.

SYSTEM OPERATION

In operation, the cantilever loading trolley 1 is placed inside cantilever loading track 104. A coarse adjustment of the height of the top plate 19 is done using coarse adjustment knob 39. As coarse adjustment knob 39 is turned, the coarse adjustment following member 10 is moved along the longitudinal axis of the threaded coarse adjustment screw 8. As the coarse adjustment following member 10 moves, the bottom adjustment axle 16 moves in a similar fashion. In this manner, and with the fine adjustment cam adjusted to minimize the height of the carrier top plate 19, the top plate 19 is oriented so that the wafer boat supporting quartz rods 28 are raised/lowered to a level just below the level of the bottom edges 105 of the slot 106 in the bottom of the diffusion tube 108. Once the coarse adjustment has been made, the quartz wafer boat 101 can be loaded onto the cantilever loading trolley 1. The fine adjustment knob 22 is used to turn the bottom adjustment axle 16. As the bottom adjustment axle 16 is turned, so is the fine adjustment cam 55. The fine adjustment cam 55 varies the position of the bottom adjustment axle 16 from the fine adjustment block 78 and thereby varies the height of the top plate 19 above the center plate 11. The fine adjustment cam 55 is a circular cam with the center of the circle offset (eccentrically) from the center of the bottom adjustment axle 16. It is this offset that allows the fine adjustment cam 55 to be stopped at any position and the height of top plate 19 to stay constant as the cantilever loading trolley 1 is moved. Once a quartz wafer boat 101 is loaded onto the cantilever loading trolley 1, the fine adjustment cam 55 is rotated (See, FIG. 6*a*) to maximize the height of the carrier top plate 19 so that the proper portion of the wafer boat 101 is supported on a level above the level of the edges 105 of the slot 106 and then the combination is moved into the cantilever diffusion tube 108. When inside the cantilever diffusion tube 108, the fine adjustment knob 22 is turned to lower the top plate 19. As the top plate 19 is lowered, the quartz wafer boat 101 rests on the edges 105 of the slot 106 in the cantilever diffusion tube 108. The cantilever loading trolley 1 is then moved back and out of the way.

While the invention has been particularly shown and described in reference to the preferred embodiments thereof, it will be understood by those skilled in the art that changes in form and details may be made without departing from the spirit and scope of the invention.

I claim:

1. A wafer boat trolley apparatus for transporting wafers into a wafer processing tube, comprising:
   an upper portion means for mounting at least one wafer means thereon;
   an intermediate portion means generally positioned on a first horizontal plane for adjustably mounting said upper portion means thereon, said intermediate portion means having a vertical adjustment means for adjustably locating a vertical position of said upper portion means relative to a position of said wafer processing tube; and
   a bottom portion means generally positioned on a second horizontal plane for accommodating thereon said vertical adjustment means, said bottom portion means having a plurality of wheel means for transporting said wafer boat apparatus thereabove a loading track into said wafer processing tube, said second horizontal plane being positioned at a fixed distance from said first horizontal plane.

2. The wafer boat trolley apparatus as in claim 1 wherein said bottom portion means has a horizontal adjustment means for horizontally moving said upper portion means and said intermediate portion means in aligning said wafers relative to said wafer processing tube.

* * * * *